(12) United States Patent
Paek et al.

(10) Patent No.: US 9,418,922 B2
(45) Date of Patent: Aug. 16, 2016

(54) SEMICONDUCTOR DEVICE WITH REDUCED THICKNESS

(71) Applicant: Amkor Technology, Inc., Chandler, AZ (US)

(72) Inventors: Jong Sik Paek, Incheon (KR); Doo Hyun Park, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/524,443

(22) Filed: Oct. 27, 2014

(65) Prior Publication Data

US 2015/0221586 A1  Aug. 6, 2015

(30) Foreign Application Priority Data

Feb. 4, 2014  (KR) .................. 10-2014-0012763

(51) Int. Cl.

| H01L 23/498 | (2006.01) |
|---|---|
| H01L 23/00 | (2006.01) |
| H01L 25/07 | (2006.01) |
| H01L 25/00 | (2006.01) |
| H01L 21/56 | (2006.01) |

(52) U.S. Cl.
CPC ........ *H01L 23/49816* (2013.01); *H01L 21/568* (2013.01); *H01L 24/17* (2013.01); *H01L 24/32* (2013.01); *H01L 24/49* (2013.01); *H01L 24/81* (2013.01); *H01L 24/83* (2013.01); *H01L 24/85* (2013.01); *H01L 25/074* (2013.01); *H01L 25/50* (2013.01); *H01L 24/45* (2013.01); *H01L 2224/2612* (2013.01); *H01L 2224/45139* (2013.01); *H01L 2224/45144* (2013.01); *H01L 2224/45147* (2013.01); *H01L 2224/49* (2013.01); H01L 2224/83005 (2013.01); *H01L 2224/85* (2013.01); *H01L 2224/85203* (2013.01); *H01L 2924/12042* (2013.01); *H01L 2924/181* (2013.01)

(58) Field of Classification Search
CPC ... H01L 23/49816; H01L 24/32; H01L 24/17; H01L 24/24; H01L 25/074; H01L 25/50; H01L 25/83; H01L 21/81
USPC .............. 257/666–796; 8/106–127, 618–688; 438/106–127, 618–688
See application file for complete search history.

(56) References Cited

U.S. PATENT DOCUMENTS

| 8,525,349 B2 * | 9/2013 | Song | ................... H01L 23/3128 257/686 |
| 2004/0056344 A1 * | 3/2004 | Ogawa | ................ H01L 23/3121 257/686 |

(Continued)

FOREIGN PATENT DOCUMENTS

| JP | 2010-165984 A | 7/2010 |
| KR | 2011-0077213 A | 7/2011 |
| KR | 2013-0016543 A | 2/2013 |

*Primary Examiner* — Karen Kusumakar
(74) *Attorney, Agent, or Firm* — McAndrews, Held & Malloy, Ltd.

(57) ABSTRACT

A semiconductor device with reduced thickness is disclosed and may include forming a back end of line (BEOL) comprising a redistribution layer on a dummy substrate. A first semiconductor die may be bonded to a first surface of the BEOL and a second semiconductor die may be bonded to the first semiconductor die. The first and second semiconductor dies may be electrically coupled to the BEOL. The first and second semiconductor dies and the BEOL may be encapsulated utilizing a first encapsulant. The dummy substrate may be removed thereby exposing a second surface of the BEOL opposite to the first surface. A solder ball may be placed on the exposed second surface of the BEOL. The second semiconductor may be stacked stepwise on the first semiconductor and may be flip-chip bonded. The semiconductor dies may be electrically coupled to the BEOL utilizing a lateral plating layer or conductive wires.

17 Claims, 8 Drawing Sheets

(56) References Cited

U.S. PATENT DOCUMENTS

| | | | | |
|---|---|---|---|---|
| 2008/0303131 A1* | 12/2008 | McElrea | ................ | H01L 24/24 257/686 |
| 2009/0140442 A1* | 6/2009 | Lin | ...................... | H01L 21/565 257/778 |
| 2010/0140759 A1* | 6/2010 | Pagaila | ................ | H01L 21/565 257/660 |
| 2010/0181661 A1* | 7/2010 | Takemoto | ............... | H01L 24/24 257/686 |
| 2010/0244208 A1* | 9/2010 | Pagaila | ................ | H01L 21/568 257/659 |

* cited by examiner

FIG. 2E

SEMICONDUCTOR DEVICE WITH REDUCED THICKNESS

CROSS-REFERENCE TO RELATED APPLICATIONS

The present application makes reference to, claims priority to, and claims the benefit of Korean Patent Application No. 10-2014-0012763, filed on Feb. 4, 2014, the contents of which are hereby incorporated herein by reference, in their entirety.

FIELD

Certain embodiments of the disclosure relate to semiconductor chip packaging. More specifically, certain embodiments of the disclosure relate to a semiconductor device with reduced thickness.

BACKGROUND

A processor mounted on, for example, a smart phone or a tablet PC, has at least one application processor (AP) and at least one low power DDR (LPDDR) vertically stacked. The processor may be configured such that packages are individually tested and only normal packages are stacked, thereby demonstrating a high assembling yield, which may be advantageous. In some cases, the processor may also be referred to as a system on chip (SOC).

In the conventional processor, a relatively thick printed circuit board (PCB) may be generally used as a substrate of an application processor, and a solder ball having a relatively large diameter may be generally used as an internal conductor. The processor has an overall thickness of approximately 1 mm or greater and a circuit pattern formed on the substrate of the processor has a width of approximately 10 μm or greater, resulting in a considerable loss of power.

In addition, since the PCB includes various kinds of organic materials, and there may be a big difference in the thermal expansion coefficient between each of the organic materials and an inorganic material, such as a semiconductor die or an encapsulant, the completed processor may warp.

In an example scenario, a high priced PCB may be purchased to manufacture a processor that is less susceptible to warpage. Such a solution, however, unacceptably increases the manufacturing cost of the processor.

Further limitations and disadvantages of conventional and traditional approaches will become apparent to one of skill in the art, through comparison of such systems with the present disclosure as set forth in the remainder of the present application with reference to the drawings.

BRIEF SUMMARY

A semiconductor device with reduced thickness, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIGS. 1a to 1k are cross-sectional views illustrating a manufacturing method of a semiconductor device according to an embodiment of the present disclosure.

DETAILED DESCRIPTION

Certain aspects of the disclosure may be found in a method for manufacturing a semiconductor device with reduced thickness comprising forming a back end of line (BEOL) comprising a redistribution layer on a dummy substrate. A first semiconductor die may be bonded to a first surface of the BEOL and a second semiconductor die may be bonded to the first semiconductor die. The first and second semiconductor dies may be electrically coupled to the BEOL. The first and second semiconductor dies and the BEOL may be encapsulated utilizing a first encapsulant. The dummy substrate may be removed thereby exposing a second surface of the BEOL opposite to the first surface. A solder ball may be placed on the exposed second surface of the BEOL. The second semiconductor may be stacked stepwise on the first semiconductor. The second semiconductor die may be flip-chip bonded to the first semiconductor die. The first and second semiconductor dies may be electrically coupled to the BEOL utilizing a lateral plating layer or conductive wires, where an insulating layer may electrically isolate the lateral plating layer from portions of the first and second semiconductor dies. The conductive wires may be encapsulated by the first encapsulant. The dummy substrate may, for example, comprise silicon, glass, silicon carbide, sapphire, quartz, ceramic, metal oxide, or a metal. The second surface of the BEOL and a portion of the solder ball may be encapsulated utilizing a second encapsulant. A pitch of the redistribution layer may be between 20 nm and 1000 nm.

Various aspects of the present disclosure may be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

In the drawings, the thicknesses of layers and regions may be exaggerated for clarity. Here, like reference numerals refer to like elements throughout. As used herein, the term "and/or" includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises," "comprising," "includes," and/or "including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

FIGS. 1a to 1k are cross-sectional views illustrating a manufacturing method of a semiconductor device according to an embodiment of the present disclosure.

Figures 1A, 1D:
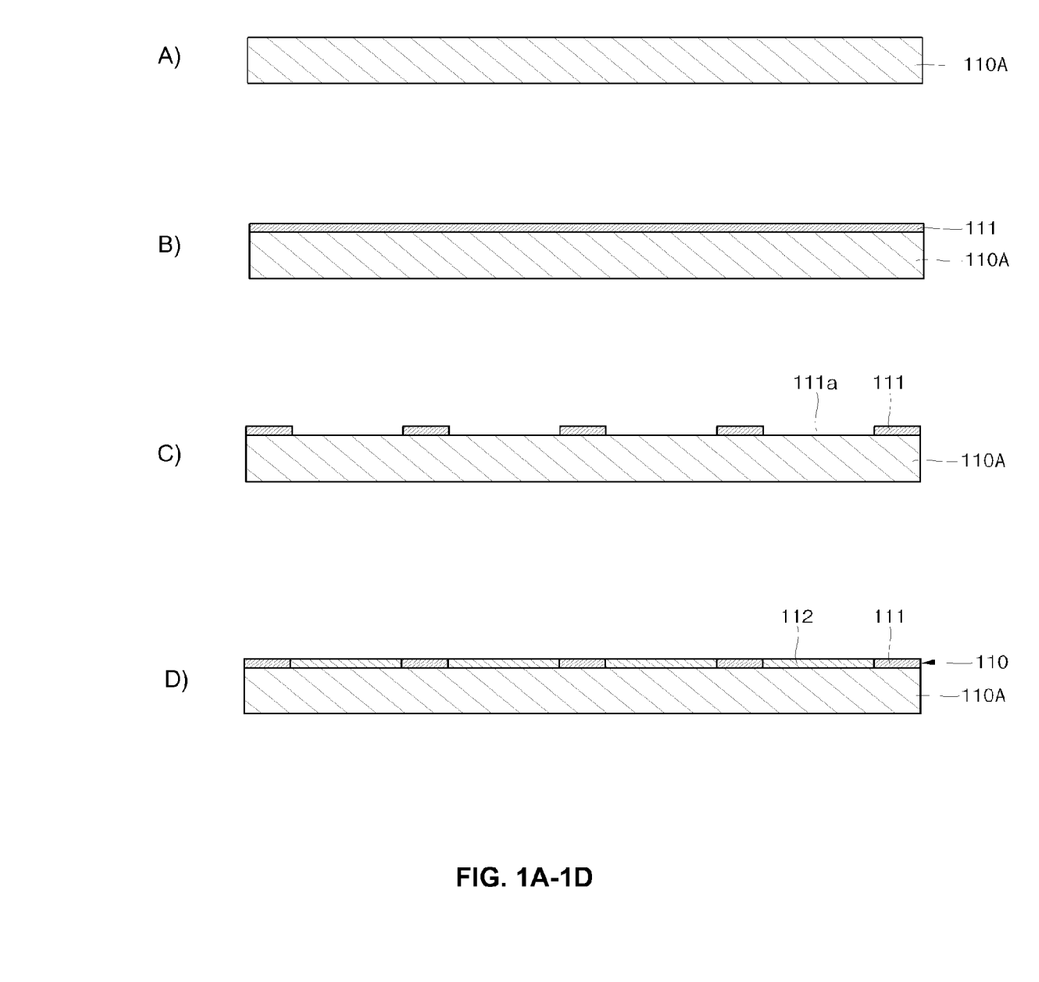

As illustrated in FIG. 1a, a dummy substrate 110A may be prepared, the dummy substrate 110A having a substantially planar top surface and a substantially planar bottom surface. The dummy substrate 110A may comprise one or more of silicon, low-grade silicon, glass, silicon carbide, sapphire, quartz, ceramic, metal oxide, a metal and similar materials, for example, but aspects of the present disclosure are not limited thereto.

A back end of line (BEOL) layer, labeled as item 110 in various figures herein, may be formed on the dummy substrate 110A. In some cases, the BEOL layer 110 may be formed with a redistribution layer.

As illustrated in FIGS. 1b and 1c, a dielectric layer 111 may first be deposited on the dummy substrate 110A, for example by a chemical vapor deposition (CVD) device, and an opening 111a may be formed, for example by a photolithography process and/or a laser process. At this point, a top surface of the dummy substrate 110A may be directly exposed to the outside by the opening 111a.

The dielectric layer 111 may comprise one or more of a silicon oxide layer, a silicon nitride layer and similar materials, for example, but aspects of the present disclosure are not limited thereto.

As illustrated in FIG. 1d, a redistribution layer 112 may be formed in the opening 111a and on the dielectric layer 111. Accordingly, the redistribution layer 112 may be brought into direct contact with the dummy substrate 110A through the opening 111a. The redistribution layer 112 may be formed by an electroless plating process for a seed layer using gold, silver, nickel, titanium and/or tungsten, an electroplating process using copper, etc., and a photolithography process using photoresist, but aspects of the present disclosure are not limited thereto.

In addition, the redistribution layer 112 may comprise one or more of copper, a copper alloy, aluminum, an aluminum alloy, iron, an iron alloy, and similar materials, for example, but aspects of the present disclosure are not limited thereto.

The step of forming the dielectric layer 111 and the step of forming the redistribution layer 112 may be repeatedly performed, thereby forming the BEOL layer 110 having a multi-layered structure.

In this example, the BEOL layer 110 includes a dielectric layer and a redistribution layer but does not include an organic core layer or an organic build-up layer, like in the conventional PCB (e.g., a rigid PCB or a flexible PCB). Therefore, the redistribution layer may be formed to have a considerably smaller thickness. For example, the redistribution layer may have a thickness of 10 µm or less, 20 µm or less, and/or in a range between 5 µm and 15 µm. By contrast, the conventional PCB may be generally formed to have a thickness of 200 µm to 300 µm.

In addition, as described above, since the BEOL layer 110 may be formed by a fabrication (FAB) process, the redistribution layer 112 may be formed to have a width, thickness and/or pitch in a range of 20 nm to 1000 nm, for example in a range of 20 nm to 100 nm, or, in a range of 20 nm to 500 nm, etc.

Therefore, the present disclosure provides a considerably finer redistribution layer 112, thereby accommodating highly integrated semiconductor dies. By contrast, the redistribution layer of the conventional PCB may be generally formed to have a width, thickness and/or pitch in a range of 20 µm to 30 µm.

In the BEOL layer 110, all or some regions of the redistribution layer 112 may be directly exposed to the outside. A semiconductor die 120 may be connected to the directly exposed redistribution 112.

Figures 1E, 1F:
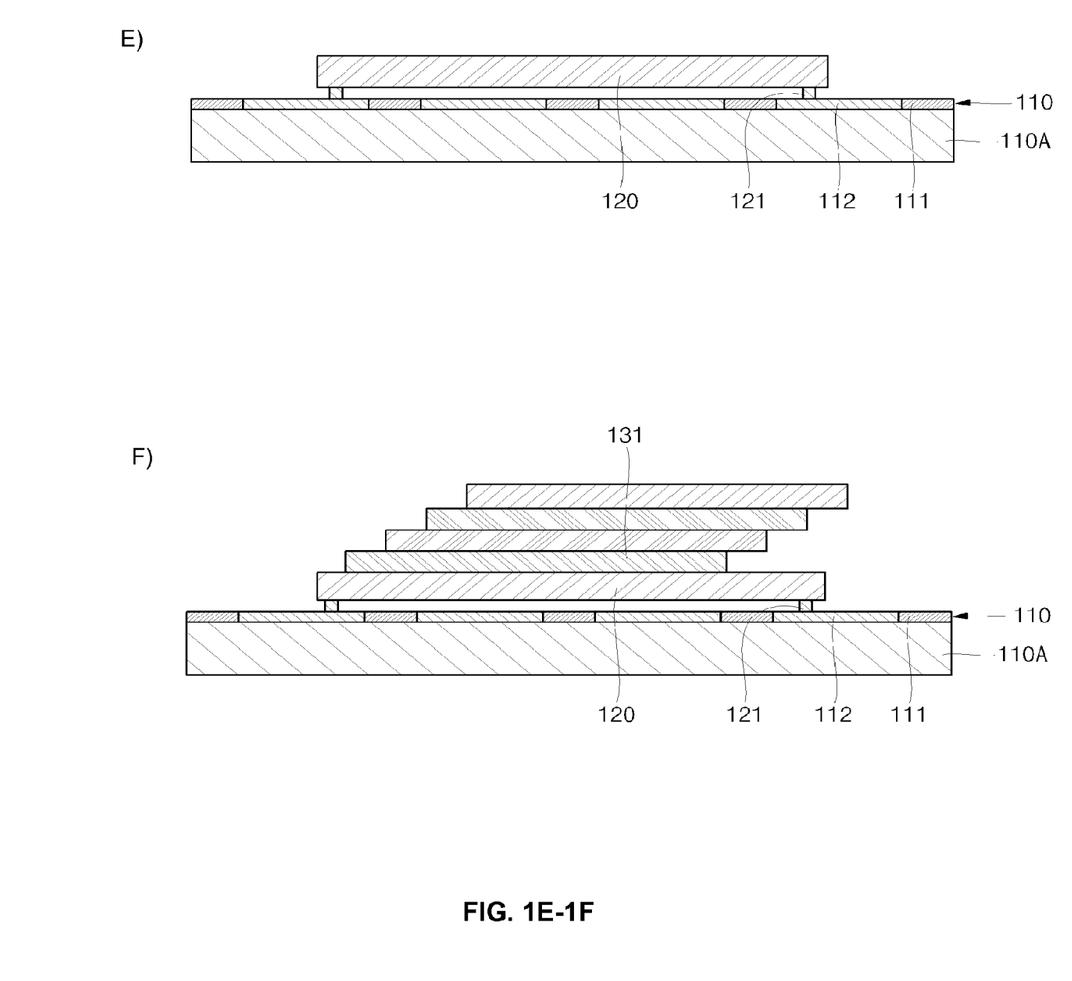

As illustrated in FIG. 1e, the semiconductor die 120 may be electrically connected to the BEOL layer 110. Accordingly, a bonding pad, a copper pillar, or a bump 121 of the semiconductor die 120 may be electrically connected to the BEOL layer 110. In addition, the semiconductor die 120 may be electrically connected to the BEOL layer 110 in a flip-chip type configuration.

The connection of the semiconductor die 120 may be achieved by a general thermal compression process, a mass reflow process, or similar processes, for example, but aspects of the present disclosure are not limited thereto. Here, the semiconductor die 120 may have a thickness of approximately 50 µm to 70 µm, but aspects of the present disclosure are not limited thereto.

Here, an underfill (not shown) may be injected into a space between the semiconductor die 120 and the BEOL layer 110, followed by curing. The underfill may further fix the semiconductor die 120 to the BEOL layer 110, enhancing stability. Even if there is a difference in the thermal expansion coefficient between the semiconductor die 120 and the BEOL layer 110, the semiconductor die 120 and the BEOL layer 110 may remain electrically connected.

In some example cases, if a diameter of a pillar of the first encapsulant 130, to be described later, may be smaller than a gap between the semiconductor die 120 and the BEOL layer 110, since the first encapsulant 130 may be directly filled in a gap between the semiconductor die 120 and the BEOL layer 110, the underfill might not be utilized.

As illustrated in FIG. 1f, at least one second semiconductor die 131 may be stacked on the first semiconductor die 120. For example, an adhesive layer (not shown) may be positioned on the first semiconductor die 120 and the second semiconductor die 131 may be adhered to the adhesive layer. In the illustrated embodiment, 4 second semiconductor dies are stacked on the first semiconductor die 120, but more than 4 or fewer than 4 second semiconductor dies may be stacked.

Here, when laterally viewed, the second semiconductor die 131 may be stacked obliquely or stepwise with respect to the first semiconductor die 120. The first semiconductor die 120 may comprise a top surface and a side surface, and the second semiconductor die 131 may comprise a side surface. The side surface of the second semiconductor die 131 may be positioned above the top surface of the first semiconductor die 120.

In an example implementation, the first semiconductor die 120 may be an advanced processor and the second semiconductor die 131 may be a low power DDR, but aspects of the present disclosure are not limited thereto.

Figures 1G, 1H:
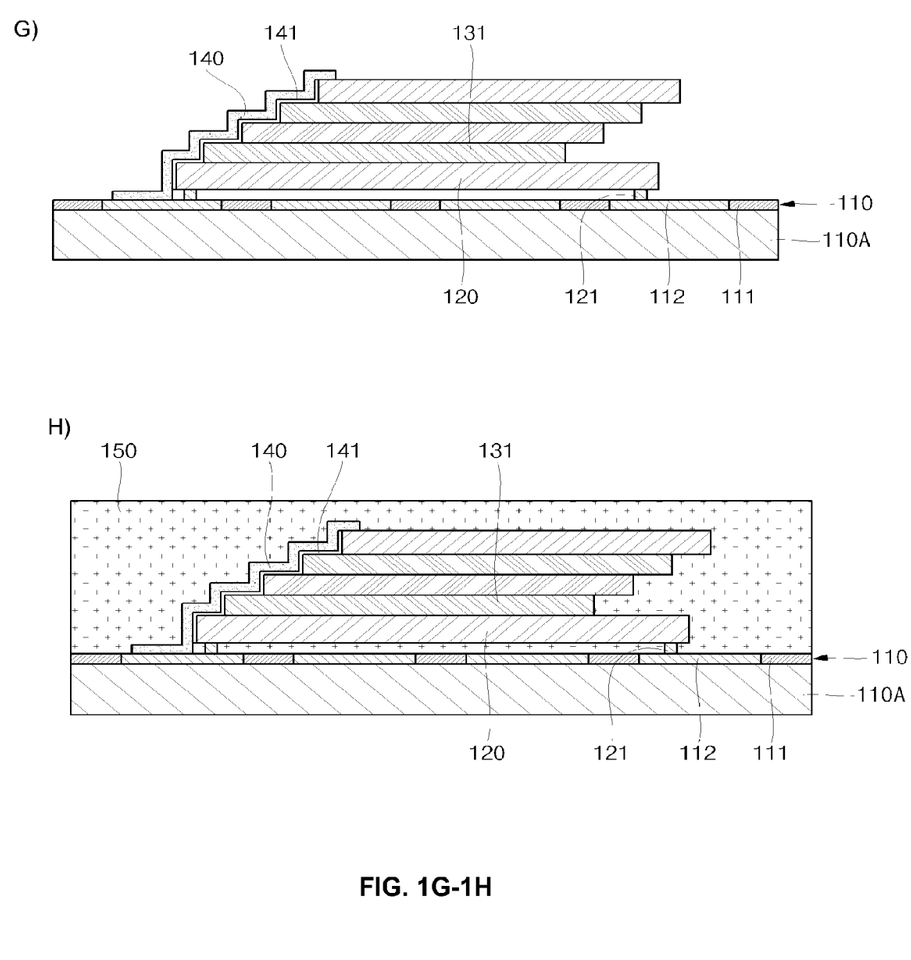

As illustrated in FIG. 1g, the second semiconductor die 131 may be electrically connected to the BEOL layer 110. For example, the second semiconductor die 131 may be electrically connected to a wiring pattern 112 of the BEOL layer 110 by the lateral plating layer 140. The lateral plating layer 140 may also be formed obliquely or stepwise due to the stacked structure of the second semiconductor die 131.

The lateral plating layer 140 may be formed using an electroless plating process for a seed layer using, for example, gold, silver, nickel, titanium and/or tungsten, an electroplating process using copper, and/or a photolithography process using photoresist, but aspects of the present disclosure are not limited thereto. An insulating layer 141 may be formed on some regions between the lateral plating layer 140 and the side surface and/or top surface of the second semiconductor die 131, and on some regions between the lateral plating layer 140 and the side surface and/or top surface of the first semiconductor die 120, thereby preventing undesired electrical shorts.

In an example embodiment, the first semiconductor die 120 may be electrically connected to the BEOL layer 110 via the lateral plating layer 140. For example, the first semiconductor die 120 may be directly disposed on the BEOL layer 110 without flip chip type bonding, and may be electrically coupled to the redistribution 112 of the BEOL layer 110 via the lateral plating layer 140 similar to that of the second semiconductor die 131.

As illustrated in FIG. 1h, the first and second semiconductor dies 120 and 131 and the lateral plating layer 140 on the BEOL layer 110 may first be encapsulated using a first encapsulant 150. Therefore, the first and second semiconductor dies 120 and 131 and the lateral plating layer 140 may be protected from the external environment. For example, the first encapsulant 150 may be brought into direct and/or close contact with the BEOL layer 110 and may completely encapsulate the first and second semiconductor dies 120 and 131 and the lateral plating layer 140, may expose a top surface of the second semiconductor die 131, etc. As shown in the example, the first encapsulant 150 may fill space that is between the first semiconductor die 120 and the one or more second semiconductor dies 131 and/or a space that is between the BEOL 110 and one or more second semiconductor dies 131, where such space for example results from stair-stepping the die stack.

The encapsulating may be achieved by one of a general transfer molding process, a compression process, an injection molding process, or similar processes, for example, but aspects of the present disclosure are not limited thereto.

The first encapsulant 130 may comprise a general epoxy, a film, a paste, and/or similar materials, but aspects of the present disclosure are not limited thereto.

In such a manner, the BEOL layer 110, the first and second semiconductor dies 120 and 131 and the lateral plating layer 140 are not separated from each other by the first encapsulant 150 but are mechanically integrally formed with one another.

Figures 1I, 1J:
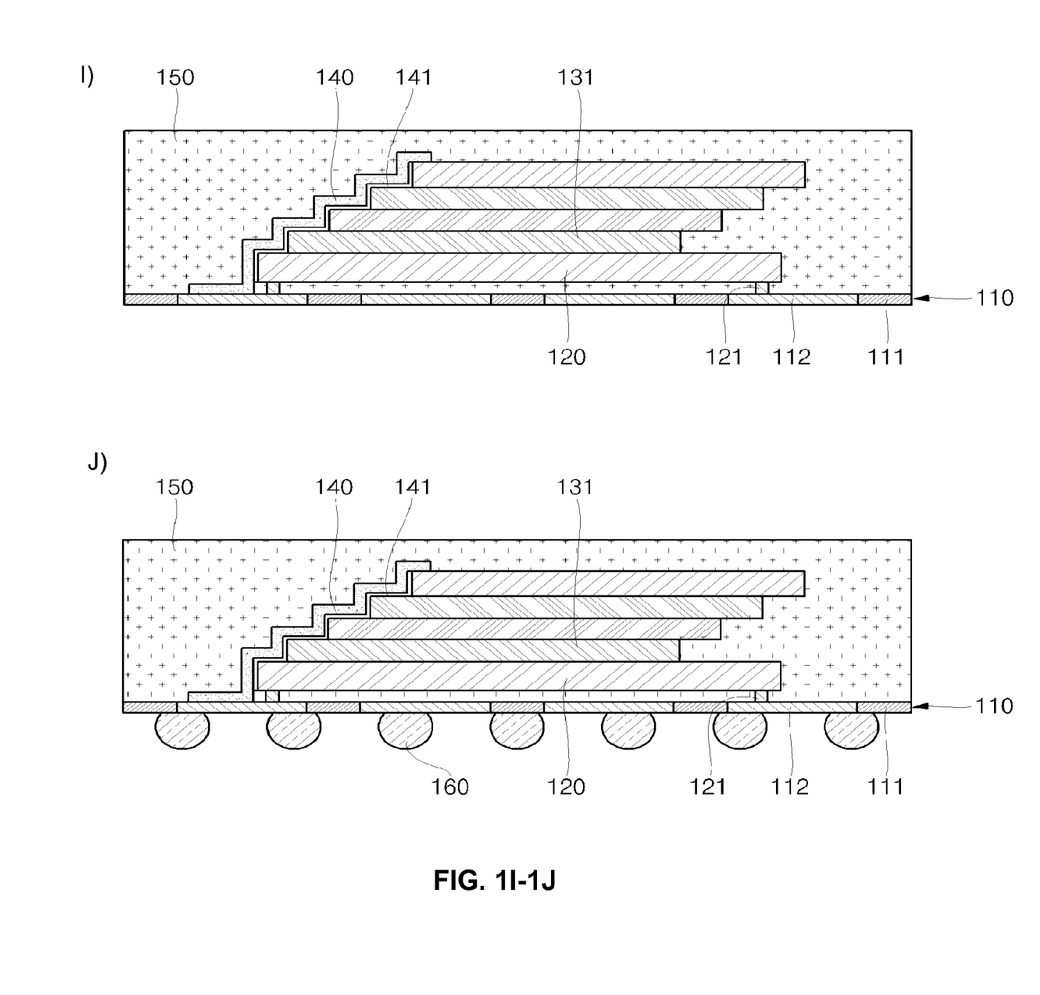

As illustrated in FIG. 1i, the dummy substrate 110A may be removed from the BEOL layer 110. For example, the first encapsulant 150 may be fixed by a support system (e.g., a wafer support system). Then, the dummy substrate 110A may be removed to a predetermined thickness through a grinding process, for example, and then completely removed by a dry and/or wet etching process.

A region (e.g., a bottom surface) of the redistribution layer 112 of the BEOL layer 110 may therefore be exposed to the outside (i.e., a bottom) through the dielectric layer 111. For example, a seed layer of the redistribution layer (using, for example, gold, silver, nickel, titanium and/or tungsten) may be directly exposed to the outside through the dielectric layer 111. In an example scenario, gold and/or silver may be directly exposed to the outside through the dielectric layer 111 in order to facilitate connection with a solder ball or another semiconductor device in a subsequent process.

As illustrated in FIG. 1j, a solder ball 160 may be connected to the redistribution layer 112 exposed to the outside (e.g., the bottom) through the dielectric layer 111. For example, a volatile flux may be coated on a predetermined region of the redistribution layer 112 exposed to the outside (e.g., the bottom) through the dielectric layer 111, the solder ball 160 may be positioned on the flux, following by a reflow process. For example, heat may be applied (e.g., a temperature of 130° C. to 250° C.) thereby causing the flux to volatilize and connecting the solder ball 160 to the predetermined region of the redistribution layer 112. Thereafter, a cooling process may be performed to make the solder ball 160 completely mechanically/electrically connected to the redistribution 112.

Figure 1K:
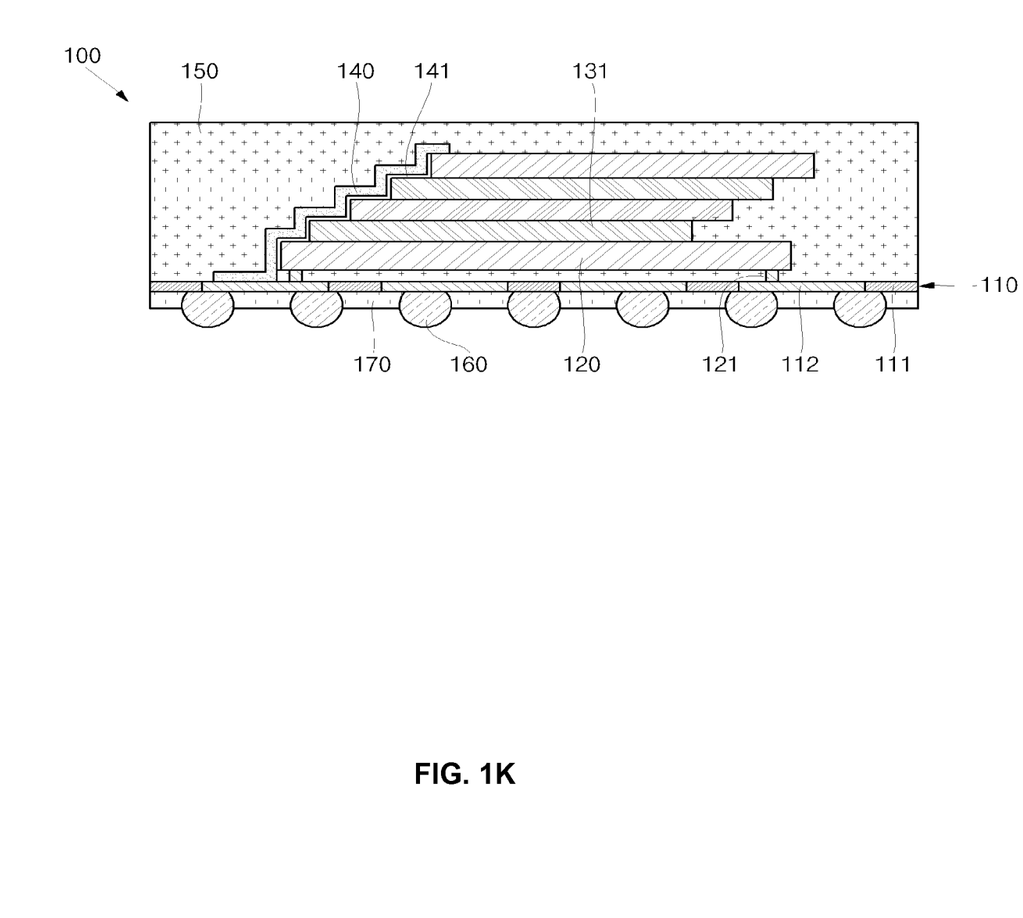
Figures 2A, 2B:
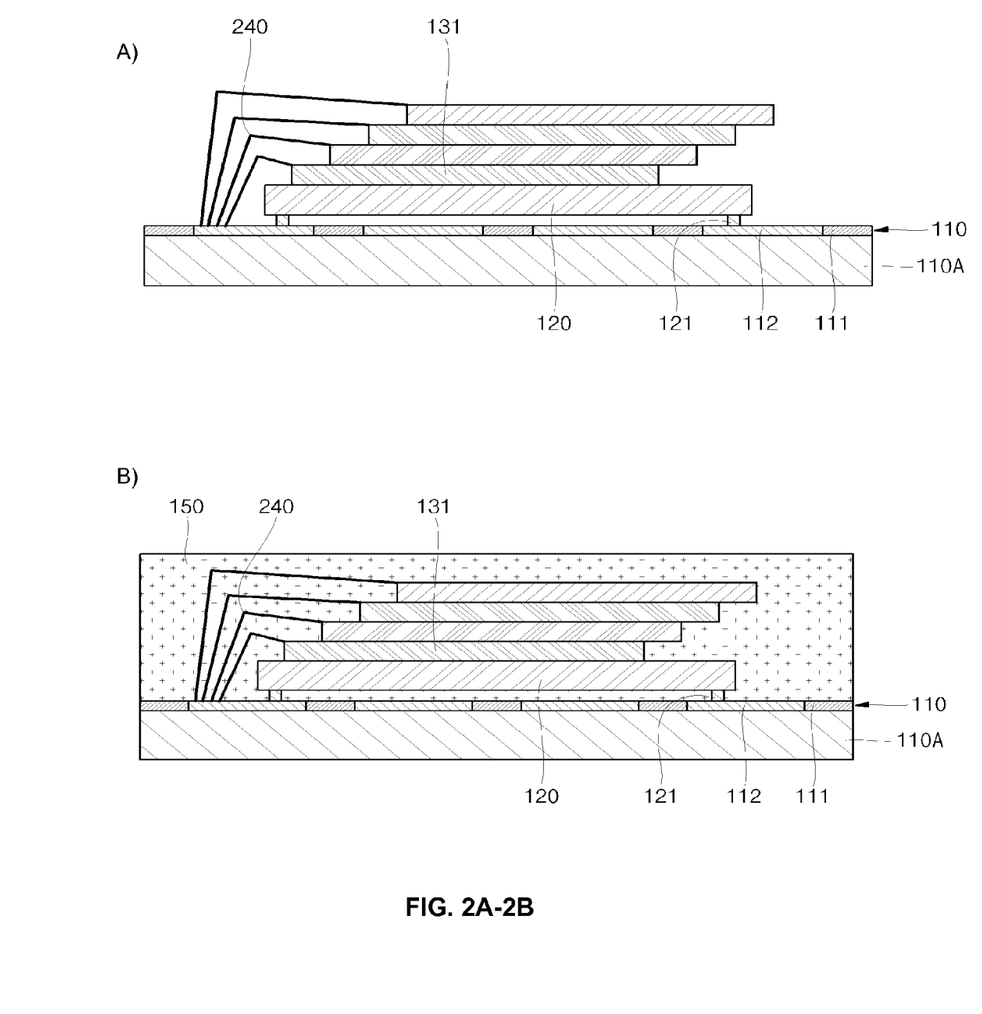
FIGS. 2a to 2e are cross-sectional views illustrating a semiconductor device according to another embodiment of the present disclosure.
Figures 2C, 2D:
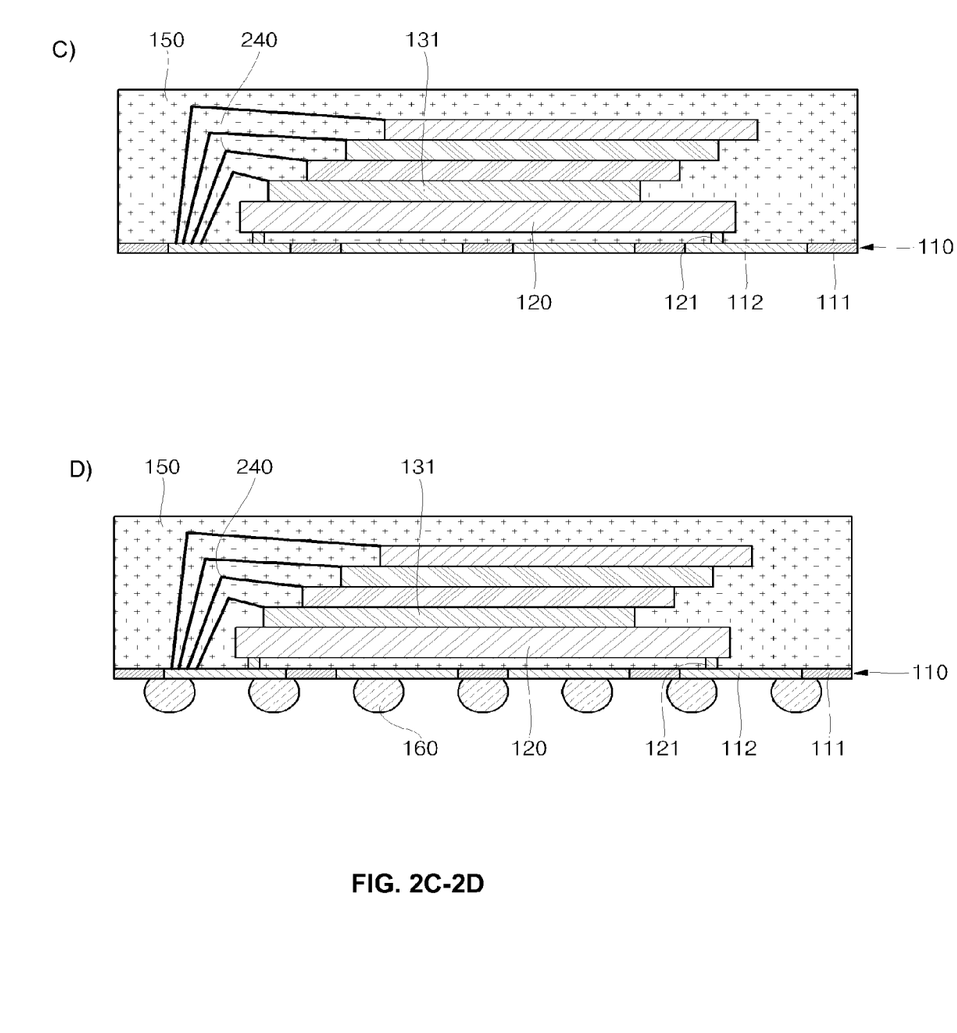
Figure 2E:
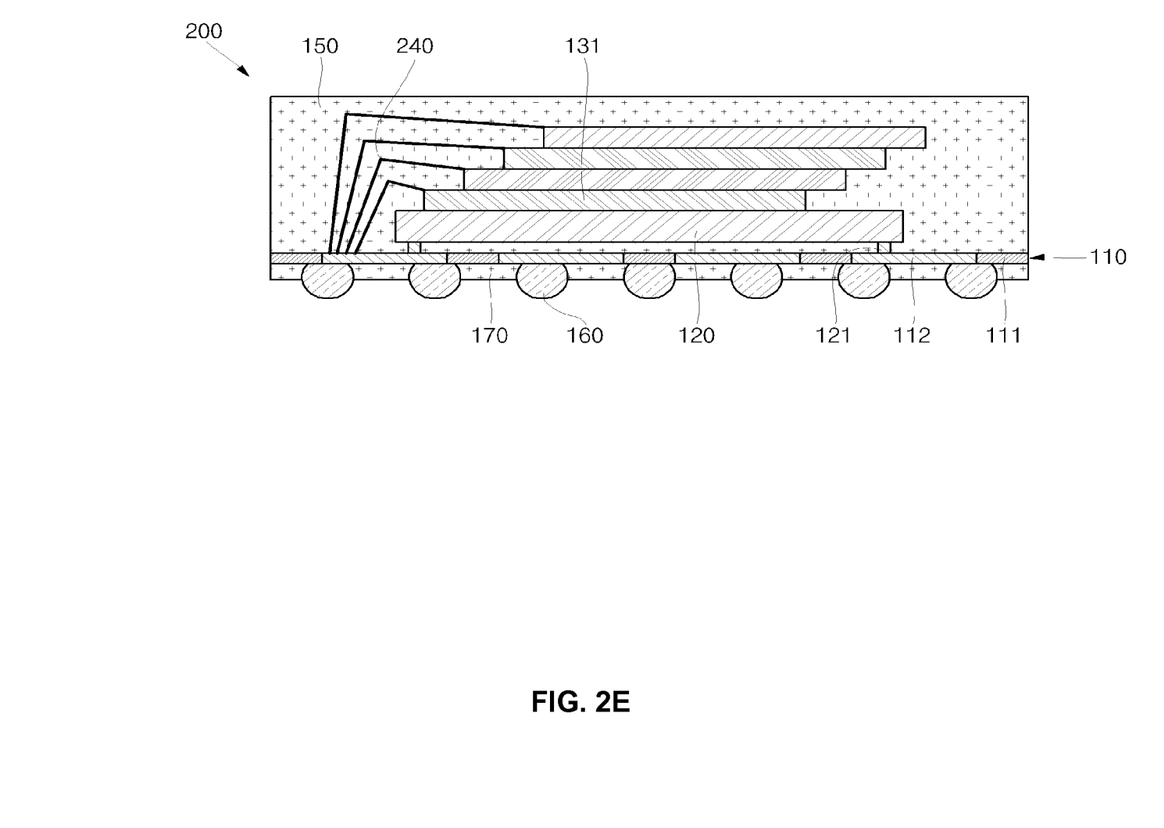

As illustrated in FIG. 1k, the BEOL layer 110 and the solder ball 160 may be encapsulated using a second encapsulant 170. The second encapsulant 170 may cover not only the dielectric layer 111 and the redistribution layer 112 of the BEOL layer 110 but also a region (a lateral region) of the solder ball 160. Here, the solder ball 160 may be exposed to the outside (the bottom) through the second encapsulant 170.

The BEOL layer 110 may be encapsulated using the second encapsulant 170 in an opposite order to the order stated above. For example, the solder ball 160 may be electrically connected to the BEOL layer 110 after the second encapsulation. For example, during the second encapsulation, the region of the redistribution layer 112 forming the BEOL layer 110 may be exposed to the outside (e.g., the bottom) for subsequent solder ball attachment.

As described above, since the conventional PCB might not be used, the present disclosure provides the semiconductor device 100 having a small thickness and good electric properties while suppressing warpage. The semiconductor device 100 may have a thickness of approximately 100 µm to 200 µm using a BEOL layer having a thickness of approximately 10 µm or less. In addition, the semiconductor device 100 having good electrical properties (having a small power loss) may be provided by the redistribution layer having a width, thickness and/or pitch in a range of 20 nm to 30 nm. Further, since the dielectric layer included in the BEOL layer may comprise an inorganic material, it may exhibit a thermal expansion coefficient similar to that of each of the first and second semiconductor dies 120 and 131 and the first and second encapsulants 150 and 170, thereby providing the semiconductor device 100 with reduced warpage.

In addition, since top and bottom surfaces of the BEOL layer 110 may be surrounded by the first and second encapsulants 150 and 170, respectively, the BEOL layer 110 can be safely protected from the external environment.

In addition, according to the present disclosure, the BEOL layer 110 may be formed using existing deposition equipment, plating equipment and/or photolithography equipment without the added expense of conventional high-priced PCBs, thereby providing the semiconductor device 100 at a reduced manufacturing cost.

FIGS. 2a to 2e are cross-sectional views illustrating a semiconductor device according to another embodiment of the present disclosure.

As illustrated in FIGS. 2a to 2e, a second semiconductor die 131 may be electrically connected to a redistribution layer 112 of a BEOL layer 110 by a conductive wire 240. In this manner, the second semiconductor die 131 and the redistribution 112 may be connected to each other by the conductive wire 240 comprising, for example, gold, silver or copper, using wire bonding equipment. In an example embodiment, the first semiconductor die 120 may be electrically connected to the BEOL layer 110 via a conductive wire 240. For example, the first semiconductor die 120 may be directly disposed on the BEOL layer 110 without a flip chip type configuration, and may be electrically coupled to the redistribution layer 112 of the BEOL layer 110 via a conductive wire 240 similar to that of the second semiconductor die 131.

As described above, according to the present disclosure, the second semiconductor die 131 and the BEOL layer 110 may be electrically connected utilizing a simplified process, thereby completing the semiconductor device 200 with a considerably reduced cost.

This disclosure provides example embodiments supporting the present disclosure. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure.

In an example embodiment of the disclosure, a method for manufacturing a semiconductor device with reduced thickness may comprise a back end of line (BEOL) comprising a redistribution layer on a dummy substrate. A first semiconductor die may be bonded to a first surface of the BEOL and a second semiconductor die may be bonded to the first semiconductor die. The first and second semiconductor dies may be electrically coupled to the BEOL. The first and second semiconductor dies and the BEOL may be encapsulated utilizing a first encapsulant. The dummy substrate may be removed thereby exposing a second surface of the BEOL opposite to the first surface. A solder ball may be placed on the exposed second surface of the BEOL. The second semiconductor may be stacked stepwise on the first semiconductor. The second semiconductor die may be flip-chip bonded to the first semiconductor die. The first and second semiconductor dies may be electrically coupled to the BEOL utilizing a lateral plating layer or conductive wires, where an insulating layer may electrically isolate the lateral plating layer from portions of the first and second semiconductor dies. The conductive wires may be encapsulated by the first encapsulant. The dummy substrate may, for example, comprise silicon, glass, silicon carbide, sapphire, quartz, ceramic, metal oxide, or a metal. The second surface of the BEOL and a portion of the solder ball may be encapsulated utilizing a second encapsulant. A pitch of the redistribution layer may be between 20 nm and 1000 nm.

The present disclosure provides a manufacturing method of a semiconductor device, which has a small thickness and good electric properties and may exhibit reduced warpage due to, for example, the absence of a printed circuit board (PCB), and a semiconductor device thereof.

The present disclosure also provides a manufacturing method of a semiconductor device, which may be manufactured at a reduced cost due to, for example, the absence of a printed circuit board (PCB), and a semiconductor device thereof.

In accordance with aspects of the present disclosure, there is provided a manufacturing method of a semiconductor device, including forming a back end of line (BEOL) layer on a dummy substrate, electrically connecting a first semiconductor die to the BEOL layer, mechanically connecting at least one second semiconductor die on the first semiconductor die, electrically connecting the second semiconductor die to the BEOL layer, a first encapsulation of the BEOL layer and the first and second semiconductor dies using a first encapsulant, removing the dummy substrate from the BEOL layer, electrically connecting a solder ball to the BEOL layer, and a second encapsulation of the BEOL layer and the solder ball using a second encapsulant.

The dummy substrate may comprise silicon, glass, silicon carbide, sapphire, quartz, ceramic, metal oxide, or a metal, for example. The first semiconductor die may be bonded to the BEOL layer in a flip-chip type configuration. The second semiconductor die may be stacked obliquely with respect to the first semiconductor die. The second semiconductor die may be electrically connected to the BEOL layer by a lateral plating layer. The second semiconductor die may be electrically connected to the BEOL layer by a conductive wire.

The first semiconductor die may comprise a first side surface, the second semiconductor die may comprise a second side surface, and the second side surface of the second semiconductor die may be positioned on a top surface of the first semiconductor die. The forming of the BEOL layer may comprise forming a dielectric layer having an opening to the dummy substrate, and forming a redistribution layer in opening in the dielectric layer. The removing of the dummy substrate may comprise grinding the dummy substrate, and etching the dummy substrate.

In accordance with aspects of the present disclosure, there is provided a semiconductor device including a back end of line (BEOL) layer, a first semiconductor die electrically connected to the BEOL layer, at least one second semiconductor die mechanically connected to the first semiconductor die and electrically connected to the BEOL layer, a first encapsulant that encapsulates the BEOL layer and the first and second semiconductor dies, a solder ball electrically connected to the BEOL layer, and a second encapsulant that encapsulates the BEOL layer and the solder ball.

The first semiconductor die may be bonded to the BEOL layer in a flip-chip type configuration. The second semiconductor die may be stacked obliquely with respect to the first semiconductor die. The second semiconductor die may be electrically connected to the BEOL layer by a lateral plating layer (e.g., in a stepped configuration). The second semiconductor die may be electrically connected to the BEOL layer by a conductive wire. The first semiconductor die may include a first side surface, the second semiconductor die may comprise a second side surface, and the second side surface of the second semiconductor die may be positioned on a top surface of the first semiconductor die.

The BEOL layer may comprise a dielectric layer, and a redistribution layer and a conductive pillar formed in the dielectric layer. An insulation layer may be disposed between the first or second semiconductor die and the lateral plating layer. As described above, in the manufacturing method of a semiconductor device and the semiconductor device thereof according to an embodiment of the present disclosure, since a printed circuit board (PCB) might not be used, the semiconductor device may have a small thickness and good electric properties and may exhibit reduced warpage. In addition, in the manufacturing method of a semiconductor device and the semiconductor device thereof according to an embodiment of the present disclosure, since a printed circuit board (PCB) might not be used, the semiconductor device may be manufactured at a reduced cost.

While various aspects of the present disclosure have been described with reference to certain supporting embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it may be intended that the present disclosure not be limited to the particular embodiments disclosed, but that the present disclosure will include all embodiments falling within the scope of the appended claims.

What is claimed is:

1. A method for manufacturing a semiconductor device, the method comprising:
    bonding a first semiconductor die to a first surface of a back end of line (BEOL) layer that comprises a redistribution layer on a dummy substrate;
    bonding a second semiconductor die to the first semiconductor die;

covering a portion of top and side surfaces of the first and second semiconductor die utilizing an insulating layer;

electrically coupling the first and second semiconductor dies to the BEOL utilizing a lateral plating layer on the insulating layer and the BEOL layer;

encapsulating the first and second semiconductor dies, the lateral plating layer, and a portion of the BEOL layer utilizing a first encapsulant;

removing the dummy substrate thereby exposing a second surface of the BEOL layer opposite to the first surface; and forming a conductive interconnection structure on the exposed second surface of the BEOL layer.

2. The method according to claim 1, wherein the second semiconductor die is stacked stepwise on the first semiconductor die.

3. The method according to claim 1, comprising flip-chip bonding the second semiconductor die to the first semiconductor die.

4. The method according to claim 1, comprising electrically coupling the first and second semiconductor dies to each other utilizing the lateral plating layer.

5. The method according to claim 4, wherein the insulating layer electrically isolates the lateral plating layer from portions of the first and second semiconductor dies.

6. The method according to claim 1, wherein the dummy substrate comprises silicon, glass, silicon carbide, sapphire, quartz, ceramic, metal oxide, and/or a metal.

7. The method according to claim 1, comprising encapsulating the second surface of the BEOL layer and a portion of the conductive interconnection structure utilizing a second encapsulant.

8. The method according to claim 1, wherein a pitch of the redistribution layer is between 20 nm and 1000 nm.

9. A semiconductor device, the device comprising:
   a back end of line (BEOL) layer comprising a redistribution layer;
   a first semiconductor die bonded to a first surface of the BEOL layer;
   a second semiconductor die bonded to the first semiconductor die;
   an insulating layer that covers a portion of top and side surfaces of the first and second semiconductor die;
   a lateral plating layer on the insulating layer and the BEOL layer that electrically couples the first and second semiconductor dies to the BEOL layer;
   encapsulant encapsulating the first and second semiconductor dies, the lateral plating layer, and the BEOL layer; and
   a conductive interconnection structure on a second surface opposite to the first surface of the BEOL layer.

10. The device according to claim 9, wherein the second semiconductor is stacked stepwise on the first semiconductor die.

11. The device according to claim 9, wherein the second semiconductor die is flip-chip bonded to the first semiconductor die.

12. The device according to claim 9, wherein the first and second semiconductor dies are electrically coupled to the each other utilizing the lateral plating layer.

13. The device according to claim 12, wherein the insulating layer electrically isolates the lateral plating layer from portions of the first and second semiconductor dies.

14. The device according to claim 9, wherein the conductive interconnection structure on the second surface of the BEOL layer is bonded to a bond pad.

15. The device according to claim 9, wherein a second encapsulant encapsulates the second surface of the BEOL layer and a portion of the conductive interconnection structure.

16. The device according to claim 9, wherein a pitch of the redistribution layer is between 20 nm and 1000 nm.

17. A method for forming a semiconductor device, the method comprising:
   bonding a first surface of a first semiconductor die to a first surface of a back end of line (BEOL) layer comprising a redistribution layer on a dummy substrate;
   bonding a second semiconductor die to a second surface of the first semiconductor die that is opposite to the first surface of the first semiconductor die;
   covering a portion of top and side surfaces of the first and second semiconductor die utilizing an insulating layer;
   electrically coupling the first and second semiconductor dies to the BEOL layer utilizing a lateral plating layer on the insulating layer and the BEOL layer;
   encapsulating the first and second semiconductor dies, the lateral plating layer, and the BEOL layer utilizing a first encapsulant; and
   removing the dummy substrate thereby exposing a second surface of the BEOL layer opposite to the first surface for making electrical contact to the second surface of the BEOL layer.

* * * * *